(12) United States Patent
Sittig et al.

(10) Patent No.: US 6,661,036 B1
(45) Date of Patent: Dec. 9, 2003

(54) SEMICONDUCTOR SWITCHES WITH EVENLY DISTRIBUTED FINE CONTROL STRUCTURES

(76) Inventors: Roland Sittig, Neuhofstrasse 10, D-38104 Braunschweig (DE); Folco Heinke, Westfalenplatz 3, D-38108 Braunschweig (DE)

(*) Notice: Subject to any disclaimer, the term of this patent is extended or adjusted under 35 U.S.C. 154(b) by 0 days.

(21) Appl. No.: 09/807,428
(22) PCT Filed: Oct. 15, 1999
(86) PCT No.: PCT/DE99/03313
§ 371 (c)(1), (2), (4) Date: Aug. 30, 2001
(87) PCT Pub. No.: WO00/24060
PCT Pub. Date: Apr. 27, 2000

(30) Foreign Application Priority Data

Oct. 21, 1998 (DE) .......................... 198 48 596

(51) Int. Cl.[7] .................. H01L 29/423; H01L 29/76; H01L 29/94; H01L 31/062; H01L 31/113
(52) U.S. Cl. .................. 257/124; 257/119; 257/329; 257/330; 257/331
(58) Field of Search ................ 257/119, 120, 257/124, 125, 137, 138, 329, 330, 331, 332, 333, 334

(56) References Cited

U.S. PATENT DOCUMENTS

| | | | |
|---|---|---|---|
| 4,571,559 A | | 2/1986 | Henry et al. |
| 5,416,350 A | * | 5/1995 | Watanabe .................. 257/330 |
| 6,049,109 A | | 4/2000 | Omura et al. |
| 6,218,217 B1 | * | 4/2001 | Uenishi et al. ............. 438/138 |
| 6,380,569 B1 | * | 4/2002 | Chang et al. ............... 257/256 |
| 6,445,012 B2 | * | 9/2002 | Takahashi et al. .......... 257/136 |

FOREIGN PATENT DOCUMENTS

| | | |
|---|---|---|
| DE | 19533956 | 3/1996 |
| EP | 0140772 | 5/1985 |
| EP | 0756330 | 1/1997 |
| FR | 2632776 | 12/1989 |

OTHER PUBLICATIONS

Q. Huang et al., "Analysis of Double Trench Insulated Gate Bipolar Transistor", Solid–State Electronics, vol. 38, No. 4, pp. 829–838, 1995.

* cited by examiner

Primary Examiner—Ngân V. Ngô
(74) Attorney, Agent, or Firm—Greenblum & Bernstein, P.L.C.

(57) ABSTRACT

Semiconductor structure configured as a semiconductor switch that can be used in various forms to switch currents. Semiconductor switch comprising non-doped or very lightly doped semiconductor crystal for switching currents in at least one direction at higher to high voltages which are significantly higher than the operating voltages of gate circuits, comprising an active region and a termination portion, wherein at least one opposite surface of the active region is provided with fine structures distributed over a wide area, which structures are substantially uniformly configured and include one conductive terminal surface each, by which charge carriers can be moved in a controlled manner into the active region of the semiconductor crystal via the fine structures in order to control a concentration of the charge carriers in the active region and thus the off-state and/or on-state of the semiconductor switch.

10 Claims, 8 Drawing Sheets

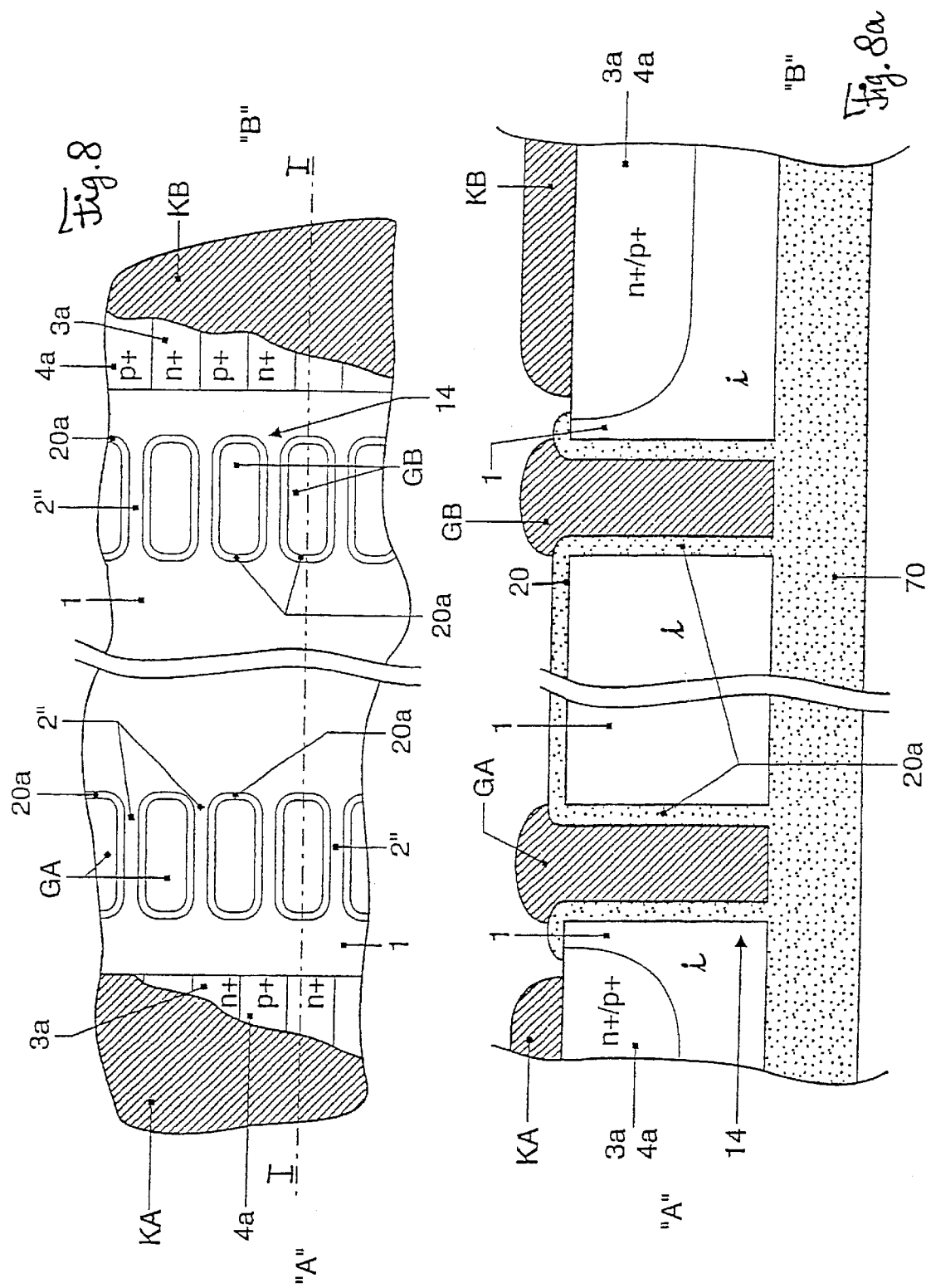

SEMICONDUCTOR SWITCHES WITH EVENLY DISTRIBUTED FINE CONTROL STRUCTURES

FIELD OF THE INVENTION

The invention relates to a semiconductor structure configured as a semiconductor switch that can be used in various forms to switch currents. Bidirectional switches of this kind are used for various circuits (I converters, matrix converters) usually at voltage levels, which are higher than those of gate circuits, of up to several thousand volts reverse voltage or blocking voltage.

SUMMARY OF THE INVENTION

The object of the invention is to create a monolithic switch that does not need to be constructed in a hybrid manner using several components, which is particularly intended to reduce the static forward and reverse power losses and to provide facilities for reducing switching losses as compared to known switches. In its most distinct form it permits realization of bidirectional switches, i.e. of switches which, at a corresponding polarity of the voltage applied, are capable turning currents on and off in both directions.

The proposed structure requires no pn junction which absorbs (blocks) the blocking voltage or reverse voltage. It rather distinguishes itself in that zones are created, the potential and thus the charge carrier concentration of which may be adjusted by control surfaces (gates). Symbolically speaking this might be considered as a "gate-controlled doping", which is adjusted by means of the gate voltage in dependence upon the polarity of the voltage at the terminal electrodes (of the main current path) and the desired state of operation.

In one embodiment, the on-state is achieved and maintained by controlling the concentration of charge carriers in the active region in an increasing sense. The controlled fine structures are influenced by fields of MOS structures in such a manner that the concentration in the active region may be enhanced over a wide area, when a first polarity of the control voltage has been selected for the MOS structure. In another embodiment, the off-state and turn-off operation are provided by wherein the control of the concentration entails the reduction of said charge carrier concentration in the active region. In this case the fine structures are influenced by the same MOS structure in such a manner that, when the polarity of the control voltage is inverted, the charge carriers are removed from the active region. These embodiments may be combined.

In other aspects, field plates in the active region on both sides equalize the field characteristics in the off-state. The two sides need not necessarily be located opposite each other on the one or other side of a crystal, they may also be disposed as "both sides" on the same side of the lightly doped or non-doped semiconductor crystal. The latter case refers to a so-called a lateral switching element which requires photo lithography on one side only during manufacture.

The fine structures of the invention may be raised above the surface of the semiconductor crystal, they may as well be lowered into the active region of the semiconductor crystal, wherein they may, when lowered, be oriented vertically as well as horizontally. The fine structures remain, regardless of how they are specifically arranged, at the surface or at least close to the surface relative to the semiconductor crystal. They are substantially evenly distributed over this surface and substantially uniformly configured.

The invention may also be employed with a semiconductor device which comprises a pn junction supplying charge carriers, which is however not suitable for absorbing the reverse voltage; in this case the switching blocking operation is possible in one direction only.

The control of the fine structures distributed in the active region over a large area may be effected on one side or both sides by means of the MOS structures, the length of which being a multiple of its width. The narrower the fine structures, the more readily a monolateral MOS structure is capable of influencing the control region in the same manner as a bilateral MOS structure.

Using the invention it is possible to produce bidirectional switches with a highly reduced thickness of the lightly doped zone. In conventional, bidirectionally blocking components, such as thyristors, a first pn junction which blocks a polarity must be supplemented by a second one which is capable of absorbing the reverse voltage of the other polarity. In this manner pnp structures are created, which require at least the double component thickness while having the same blocking capacity. In accordance with the invention the same lightly doped zone is capable of absorbing the blocking voltage as well as the reverse voltage. Due to the low thickness of the main crystalline area lower forward voltages may also be achieved according to the invention.

By controlling the gate voltages of the MOS structures at the "fine structures" opposite the respective adjacent terminal surface, the level of the excess concentration may be adjusted during operation. Thereby minimizing the losses for the respective operation.

The capacities contributing to the control capacities from control surface GA to the opposite terminal electrode KB and on the other side from control surface GB to the opposite terminal electrode KA may be kept relatively small in accordance with the ratio of the structure width to the distance between two fine structures so that the control effort is kept low.

By means of a partial discharge of the component effected prior to turning-off, the turn-off losses may be significantly reduced as compared to those of thyristors capable of being turned off (e.g. a GTO).

The low requirements to the process of manufacture are of particular significance. The component is virtually completely composed of unchanged semiconductor starting material. No pn junctions capable of blocking no doping concentrations to be precisely adjusted and no recombination centers are required. Solely contact areas, from which electrons and holes (as first and complementary second charge carriers) may be injected or drained off, respectively, are provided. These may be highly doped areas, which are short circuited to each other via a terminal surface, which are however areas of short extension transverse to the surface. They may however also be suitable Schottky contacts.

The by far prevailing active region of the semiconductor crystal is covered with an insulating layer and screened by conductive field plates, which equalize the field across the semiconductor crystal in the blocking state. The reduced technological effort of manufacture is of particular advantage especially for semiconductor materials, in which doping is extremely difficult to achieve, such as silicon carbide.

BRIEF DESCRIPTION OF THE DRAWINGS

FIG. 8, FIG. 8a illustrate a plan view and a section I-I of a lateral switching component with fine control structures 14 on one side of the semiconductor crystal only.

DETAILED DESCRIPTION

Figure 1:
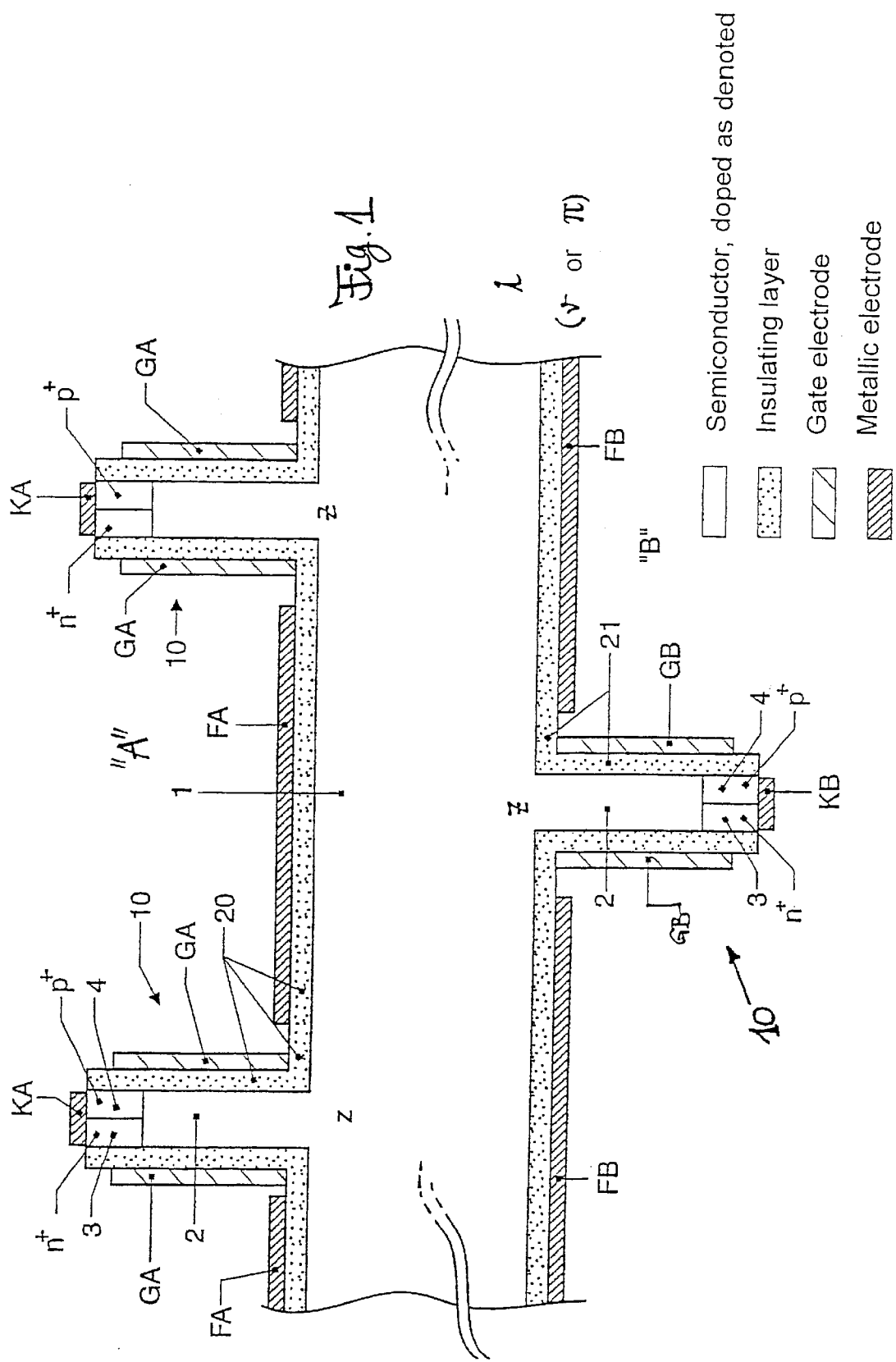
FIG. 1 is a cross section through the active region 1 of an example of a bidirectional semiconductor switch comprising a semiconductor crystal, a first terminal electrode KA on a first side "A" and a second terminal electrode KB on an opposite, other side "B". The legend shows the configuration of the individual layers, the doping of the semiconductor, the insulating layers, the gate electrode and the metallic electrodes.
Figure 2:
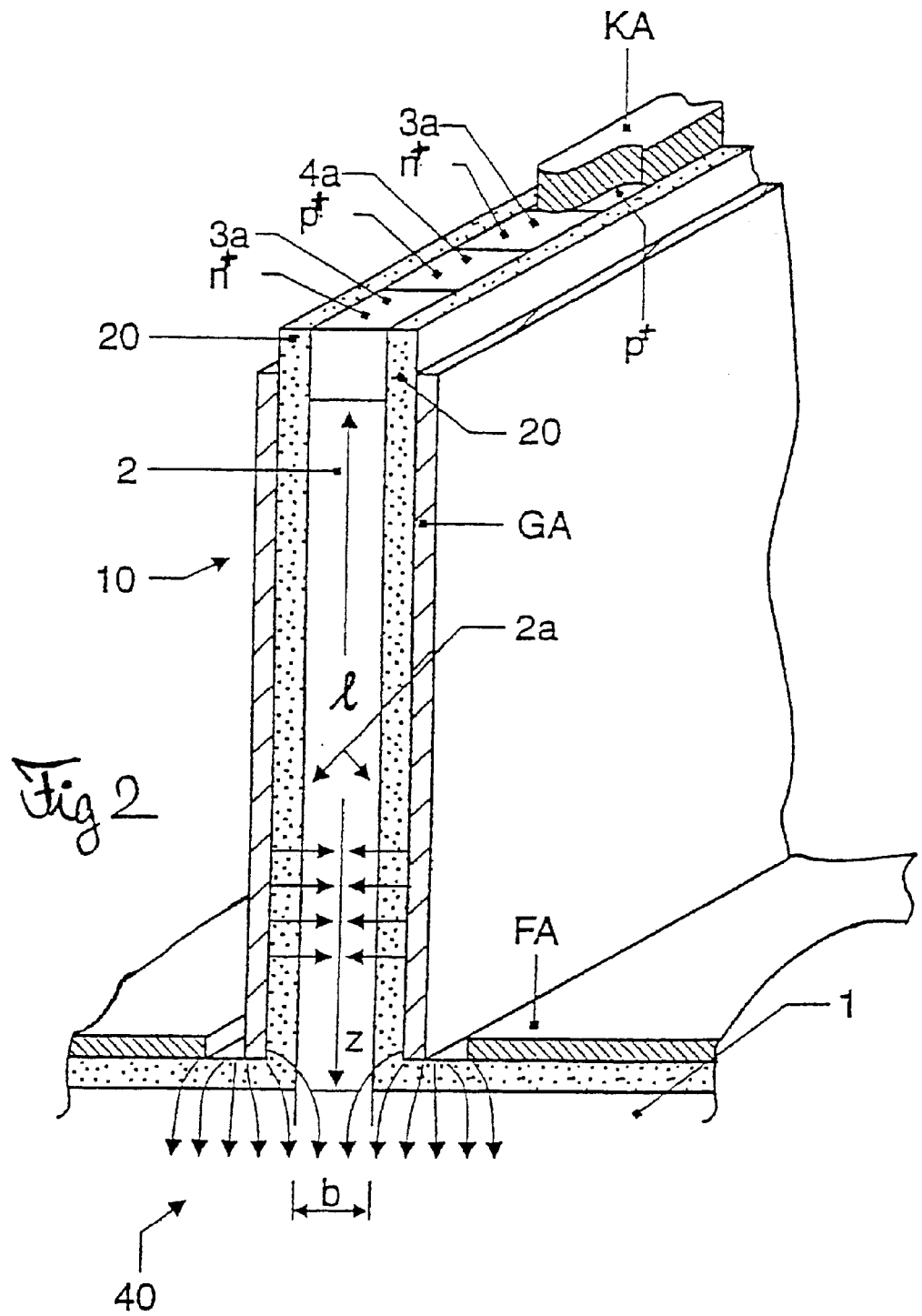
FIG. 2 illustrates a mesa structure of FIG. 1 in perspective view. The terminal electrode KA is illustrated in broken-away representation in order to clearly show the doping structure 3a, 4a below the electrode KA and on the top end of the mesa 2.

A cutout from the periodically constructed structure of a bidirectional semiconductor switch is schematically represented in FIGS. 1 and 2. The dimensions are of highly varying size and thus not represented to scale. The component is composed of a, for example, rectangular wafer of a semiconductor crystal, typically of silicon, especially silicon carbide. The active area 1, taking over the switching function, is distinguished over the termination portion 50, 51 of FIG. 3. FIG. 1 represents a cutout from the active region only. The structures on the top side "A" and the bottom side "B" are periodically continued across the entire surface of the active region; they are identical on the top and bottom sides. They may, but need not, be oriented relative to each other and are shown offset from each other in FIG. 1. Each individual structure is very small compared to the thickness of the semiconductor wafer, which itself is composed of intrinsic (i.e. non-doped, usually denoted "i") or of very lightly n doped (usually denoted "n") or of very lightly p doped (usually denoted "p") semiconductor crystal and is to have a concentration of recombination centers which is as low as possible (charge carrier life as high as possible).

Figure 4:
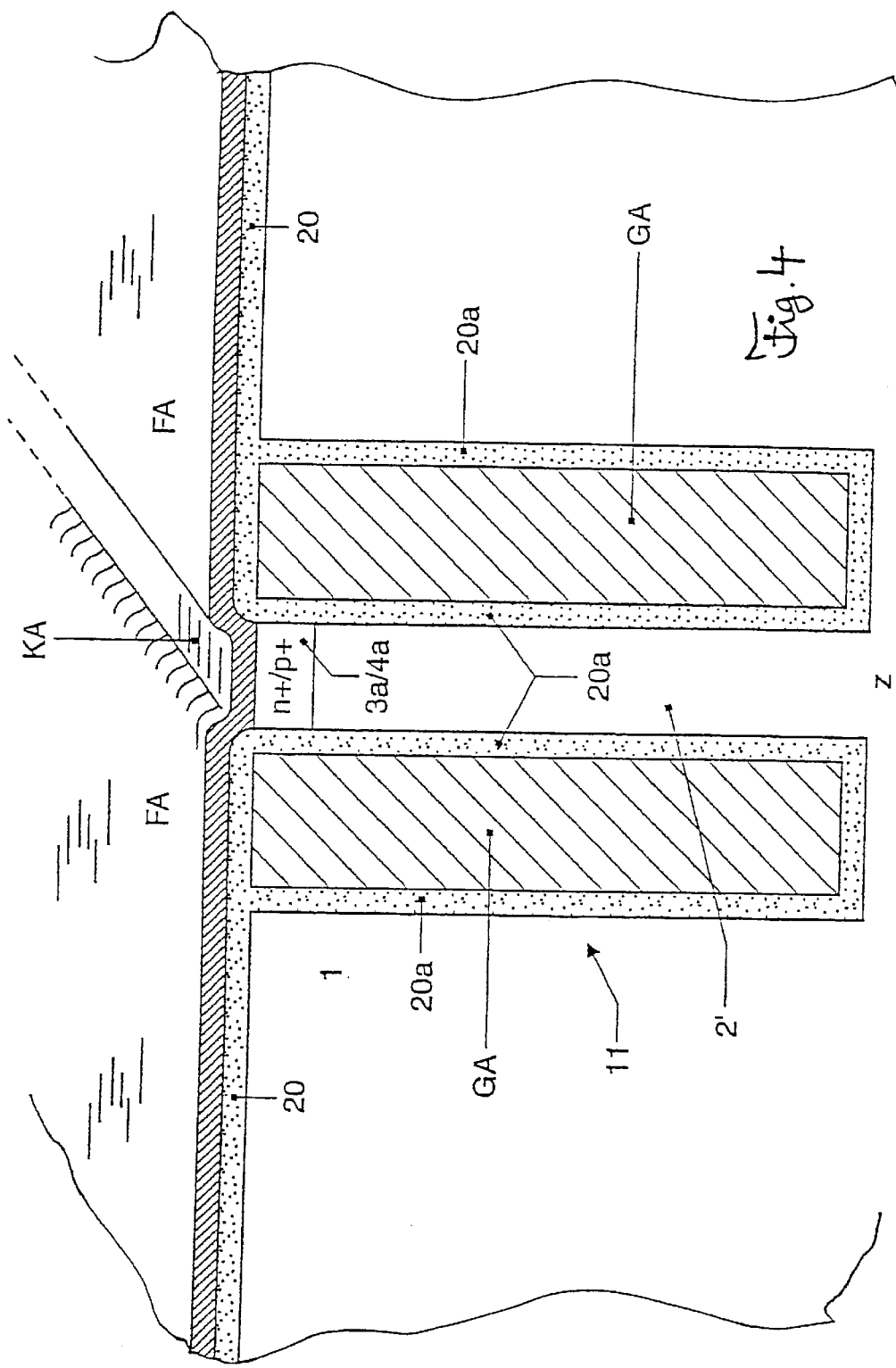
FIG. 4 illustrates a cross section through a structure having mesas 11 lowered or buried by means of trench technology, by which the gate electrodes GA, GB are lowered into trenches corresponding in height to that of the mesas depicted in FIG. 1.
Figure 5:
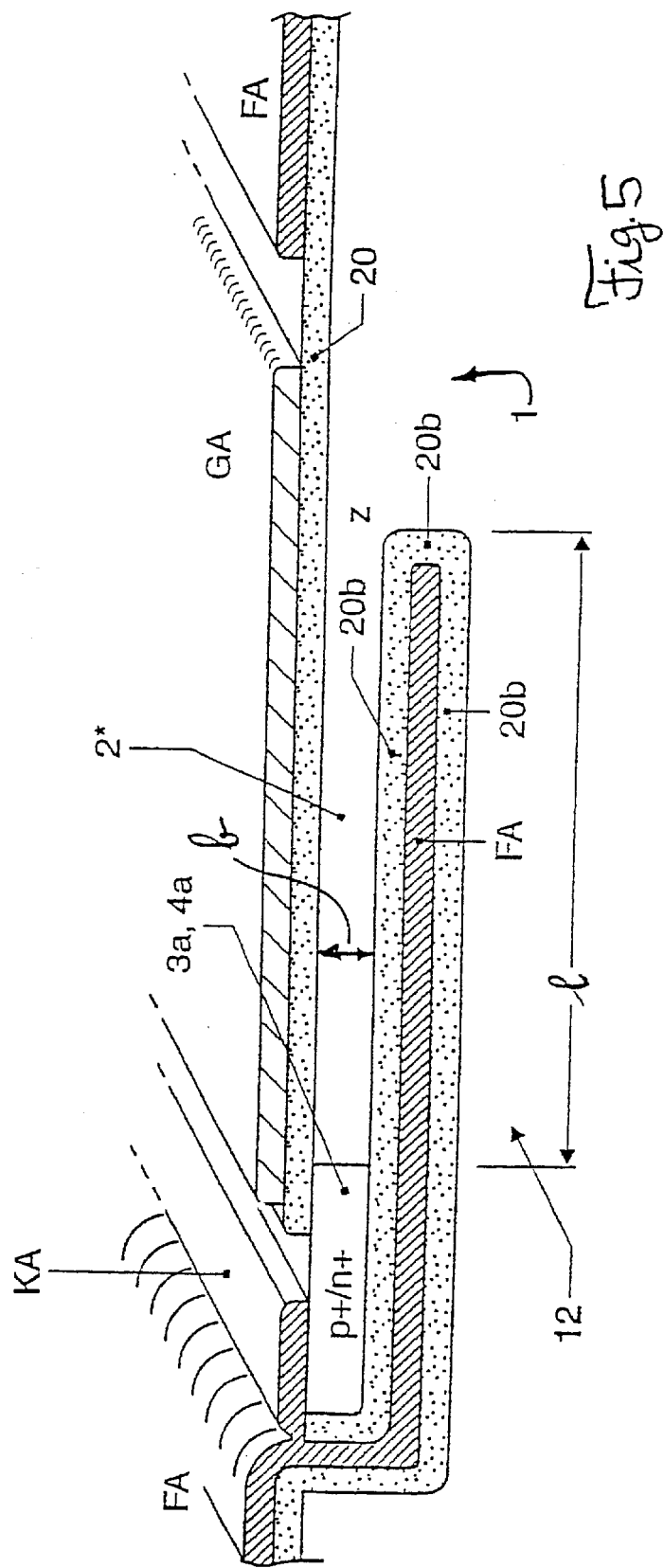
FIG. 5 shows a further structure form. This structure is created by halving the mesa of FIG. 2 and "folding it over" onto the insulated field plate FA in order to form a "lying mesa" 12. With this structure it is particularly easy to make the "width of the mesa" b substantially smaller.

The distributed fine structures may be formed both as columns (equal in extension perpendicular to the plane of projection and in the plane of projection) and as mesas 10 (extending perpendicular to the plane of projection and across the entire active region), wherein embedded horizontal or vertical control structures according to FIGS. 4, 5 are feasible as well. In the following the mesa-like structures 10 are to be further described in order to explain all kinds of such structures. Only the outer ends of said mesas have a high doping, i.e. in the $n^+$ and $p^+$ regions 3, 4, respectively, which are short circuited to each other by terminal electrodes KA and KB, respectively. For mesa-like structures said highly doped regions 3a, 4a may also be formed successively and perpendicular to the plane of projection, as shown in FIG. 2.

Apart from the areas contacted to KA and KB the entire active region 1 is covered with an insulation layer 20, 21 on both sides. For silicon, for example, with a high-quality silicon oxide layer, as is common for gate oxides. Said oxide layer is covered on the actual wafer surfaces with highly conductive (metal or highly doped polycrystalline silicon) field electrodes FA or FB, respectively, which are electrically connected to the respective terminal electrodes of the side, FA to KA and FB to KB.

On the mesa walls positioned perpendicular to the wafer surface the oxide layer is covered with gate electrodes GA and GB, respectively, which for silicon typically consist of highly doped, highly conductive, polycrystalline silicon. The component thus includes the two main terminals KA (connected to FA) and KB (connected to FB) and the two control electrodes GA and GB.

In order to describe the function a cutout from a mesa 10 of FIG. 1 is shown in enlarged representation in FIG. 2. For this purpose n+ and p+doped regions 3a, 4a, 3a (etc.) are shown in alternating manner in the longitudinal direction therein. Due to the symmetry of the arrangement only one voltage direction between the main terminals KA, KB needs to be considered.

For reasons of simplicity one voltage source of the voltage $U_{AB}$ (e.g. $U_{AB}$=1000 V) is considered. KA is connected to the positive pole, KB is connected to the negative pole.

Blocking:

A positive gate voltage $U_{GKA}$ which is higher than the threshold voltage of the MOS structure (GA—oxide layer—mesa semiconductor) of approx. +10 V is applied to GA opposite to KA on the one side "A" of the semiconductor crystal. In direct vicinity of the mesa surface and the mesa basis opposite to GA an electron accumulation layer 2a is formed. This largely screens the positive potential of GA from the mesa interior 2, however, when the width of the mesa b is chosen small enough, there is still a positive potential of approx. 0,3 V present also in the center of the mesa opposite to KA. As a result an electron concentration which is substantially higher than the hole concentration is created also in this area. Mesa 10 with its interior 2 at this gate voltages thus acts as if n doped.

On the other side "B" of the semiconductor crystal, in order to block voltage $U_{AB}$ in the predetermined polarity, a negative gate voltage $U_{GKB}$ of approx. 10 V is applied to GB opposite to KB. Then a hole accumulation layer is formed at the respective mesa surfaces in this area and the mesas acts as if p doped inside. Voltage $U_{AB}$ is now directed such that, with these charge carrier distributions caused by the gate voltages, there is virtually no current flow. Only the respective "minority charge carriers", i.e. holes from the mesa bases "z" of the one side "A" or electrons from the mesa bases of the other side "B", respectively, are drained off by the electrical field, which extends across the entire intrinsic region 1, and contribute to the reverse voltage.

The mesa bases correspond to the transition areas z from the fine structures towards the main crystalline area.

An exemplary calculation, given mesa widths of 0,3 $\mu$m and $U_{GKA}$ of 10 V, yields a potential of approx. +0,3 V and accordingly a concentration of electrons of several $10^{16}$ cm$^{-3}$ in the interior of the mesa. At a temperature of 400K, in accordance with the typical maximum allowable operating temperature of comparable components, this results in a hole concentration of several $10^9$ cm$^{-3}$ and a reverse current density of less than 1 mA cm$^{-1}$.

In the blocking state the component is also conceivable as a plate capacitor having the "plates" FA and FB. As the voltage increases the electrons are drained off from the intrinsic region 1 via the "fine structures" formed as mesas on the one side towards the +pole and the holes are drained off via the respective "fine structures" on the other side towards the –pole. Newly formed charge carriers created by generation in the depleted, intrinsic region 1 likewise flow off and thus contribute to the reverse current as well. The lines of electric flux 40 extend virtually perpendicular through the semiconductor wafer from FA to FB. In the area of the mesa bases z, however, the lines of flux start at the even more positive gate electrodes GA and extend from there on a curved path through the oxide and towards the other side of the component, as is shown in FIG. 2. When the length l of the mesa 10 is sufficient there are no vertically extending lines of flux 40 in the center 2 of the mesa.

Forward State:

If at equal polarity of $U_{AB}$ the poles of gate voltages are now changed, i.e. $U_{GKA}$ to −10 V opposed to KA and UGKB to +10 V opposed to KB, hole accumulation layers 2a are now formed on the first side "A" and analog electron accumulation layers are formed on the other side "B". However, this results, given the polarity $U_{AB}$, in an immediate current surge and thus, at external load, in a breakdown of the voltage across the component. The electrons drifting from side B to side A cannot be drained off by the insulated electrodes FA, but must diffuse laterally up to a mesa. The mesa areas are partially swamped by electron-hole plasma. The electrons are drained off via the n+regions towards terminal KA. The level of the possible excess concentration and thus the forward voltage drop can be influenced by the distance between two mesas.

For turning-off the component may at first be partially discharged. For example, if both gate voltages are set to $U_{GKA}=U_{GKB}=0$ V, the accumulation layers will vanish. This means that the hole accumulation layer does no longer exist on side A so that conductivity for the holes and thus the hole current is significantly reduced in the mesa. The concentrations of electrons and holes will equalize and the electron current will thus increase significantly in the mesa. Since on side B the inflow of electrons is diminished by reduction of the electron accumulation layers and the flow-off of holes is increased at the same time, the component is discharged at a constant current. After a discharging phase, the gate voltages may then be adjusted according to the polarity in the blocking state, i.e. $U_{GKA}=+10$ V, $U_{GKB}=-10$ V, and the component thus be turned off. It is then completely discharged and absorbs voltage again.

In order to optimize the turn-off operation the gate voltages may be varied dependent on time and in dependence upon the discharge state of the semiconductor.

For silicon the wafer thickness of the semiconductor material is selected in accordance with the blocking capacity contemplated. It may be assumed that approx. 10 V blocking voltage can be absorbed per 1 $\mu$m silicon thickness, i.e. for example 2000 V by a wafer having a thickness of 200 $\mu$m. For screening the vertical electric fields at the mesa basis z, the mesa width b will be selected as small as possible. For example, widths ranging from 0,2 $\mu$m to 2,0 $\mu$m are conceivable as typical widths. In order to avoid vertical fields in the mesa, the mesa length l should be a multiple of the mesa width, approx. 3 to 10 times the mesa width. The depth may be freely chosen depending for example on the load current to be conducted. The distance between two mesas can be chosen to amount approx. up to 10 to 20 times the mesa width and the size of the n$^+$and p$^+$regions at the mesa contacts KA, KB should not be greater than the mesa width. These statements are exemplary and are intended to give a more detailed picture only.

Figure 3:
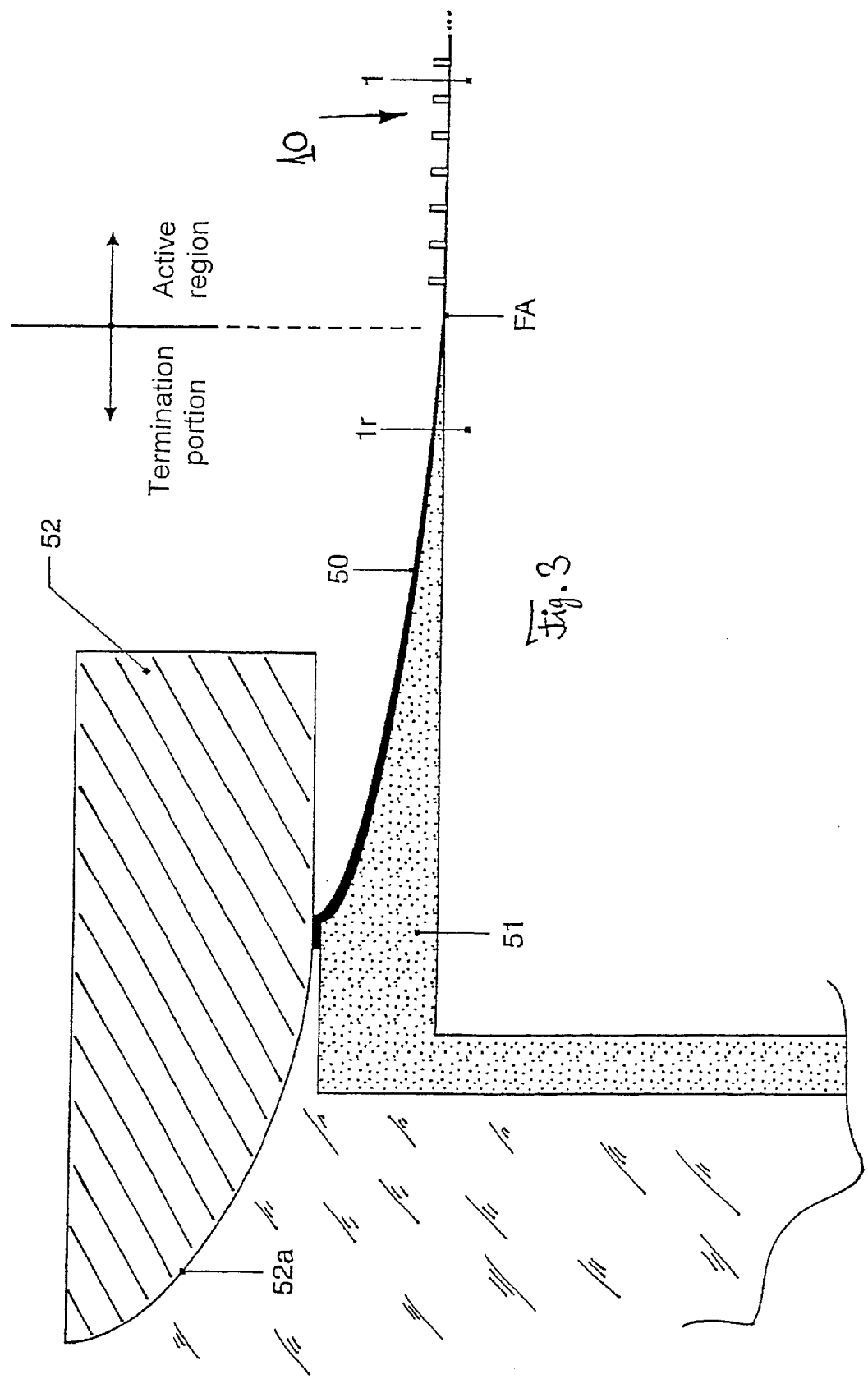
FIG. 3 illustrates a junction termination towards the active region in accordance with FIG. 1 which comprises a continuously curved field plate 50, which is connected to the metallic layer FA or FB, respectively, on the respective side of the semiconductor. The mesas or columns 10 are schematically represented at the beginning of the ascending field plate 50. The ascending field plate which is more curved at the end portion rests on an insulating layer 51 having a correspondingly shaped surface, which may be formed of $SiO_2$.

If the component is to be used for a bidirectional mode of operation it is advisable that reduction of the electric field strength in the termination portion is not effected simply by unsymmetrically doped regions, for example in the form of the standard systems of field rings or by variation of the lateral doping progression. Instead field plates 50 suggest themselves as junction terminations, which are continuously curved away from the semiconductor, as schematically illustrated in FIG. 3, as well as in WO 99/27582 (Fraunhofer).

Figure 7:
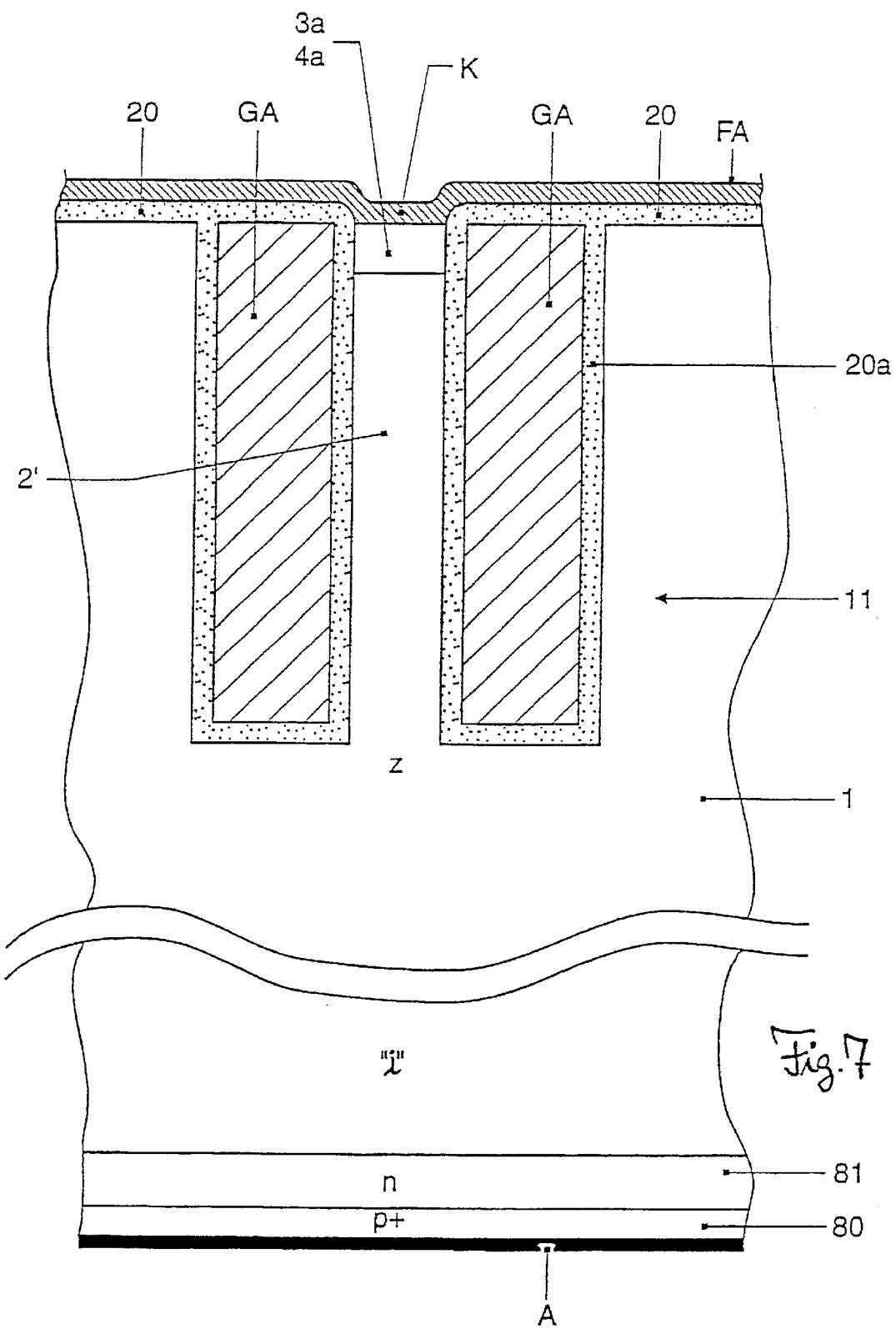
FIG. 7 shows a cutout from the active region 1 of a thyristor capable of being turned off with a structure made in trench technology, similar to that of FIG. 4.

The principle of function on which the component is based may be realized by means of various structures, which differ mainly in terms of the effort required in the process of manufacture. For example, the thin columns or long mesas illustrated in FIG. 1 and FIG. 2 may appear to be not robust enough and the contacting with the terminal electrodes KA, KB to be highly difficult. The entire structure of the mesa may also be "buried" in the semiconductor crystal, as shown in FIGS. 4, 7 or 8.

For this purpose trenches are etched into the semiconductor body so that the desired "mesas" 2', 2" remain upright. The walls of the trenches are insulated by an oxide layer 20a and the trenches are subsequently filled up with the highly conductive gate electrodes GA. The gate electrode thus forms a continuous grid or grating below the surface, which grid or grating is provided with terminal surfaces for external contacting in one or more locations. Said "trench technology" was developed for the production of data memories and is part of the prior art. The contacting of the terminal electrodes KA, KB now becomes particularly easy, since even with a gate electrode GA, which is insulated by an oxide layer 20 on top, only the metallic coating for the field plates FA, FB and the terminal surfaces KA, KB needs to be applied to the entire surface.

Further modifications are possible also to this structure. The effect of the gate is in fact only required towards the mesa interior 2, 2', 2", while unwanted capacity only is created opposite the semiconductor volume on the other side or the bottom side. Thus, if wider trenches were provided, the insulating layer could be formed much thicker on this side facing away from the mesa interior. If even wider trenches were provided, also the field plate FA could finally be guided via the other wall to the bottom of the trench.

A structure form taking this consideration into account is shown in FIG. 5. This structure is created in that the mesa 2 of FIG. 2 is halved and "folded over" onto the insulated field electrode. With this horizontally oriented fine structure it is particularly easy to make the "mesa width" b substantially smaller and to highly increase the ratio l/b without surpassing mechanical strength limits.

The halved and horizontally folded structure form of FIG. 2 is illustrated in a lowered state in FIG. 5. The mesa 2 of FIG. 2 herein corresponds to the narrow control region 2*, which is composed of non-doped or lightly doped semiconductor crystal, such as the active region 1, into which the horizontally folded mesa region 2* opens via the transition zone z. Zone z corresponds to the bottom region or mesa base zone z of FIG. 2. The field plate FA which is lowered into the semiconductor crystal 1 in the active region has an angular shape and, left in FIG. 5, is conductively connected the field plate lying on the surface. The long leg of the angular extension has a length l which is greater by a multiple than the remaining thickness of the control region 2* which is denoted b. The lowered field plate FA, which is of angular shape in its left termination portion, is insulated on both sides by a horizontally positioned insulating layer 20b from the semiconductor crystal. On the opposite side, i.e. the surface of the fine structure 12, which is shown in FIG. 5, a MOS structure is formed consisting of the gate terminal GA, the horizontal insulating layer 20 on the surface of the crystal 1 and the controlling mesa region 2*. The swamping and draining off of charge carriers in the transition area z is controlled by the MOS arrangement in dependence upon the control voltage opposite to the terminal electrode KA. The control of the charge carriers (electrons or holes) is effected in accordance with the aforementioned embodiments and will not be described individually here. In the angular region, close to the terminal surface KA the highly doped zone 3a, 4a is provided which has a short extension in the longitudinal direction l of the fine structure 12 only.

Despite the control region 2* which could be configured much narrower the mechanical strength of the fine structure 12 constructed in accordance with FIG. 5 is considerable.

Figure 6A:
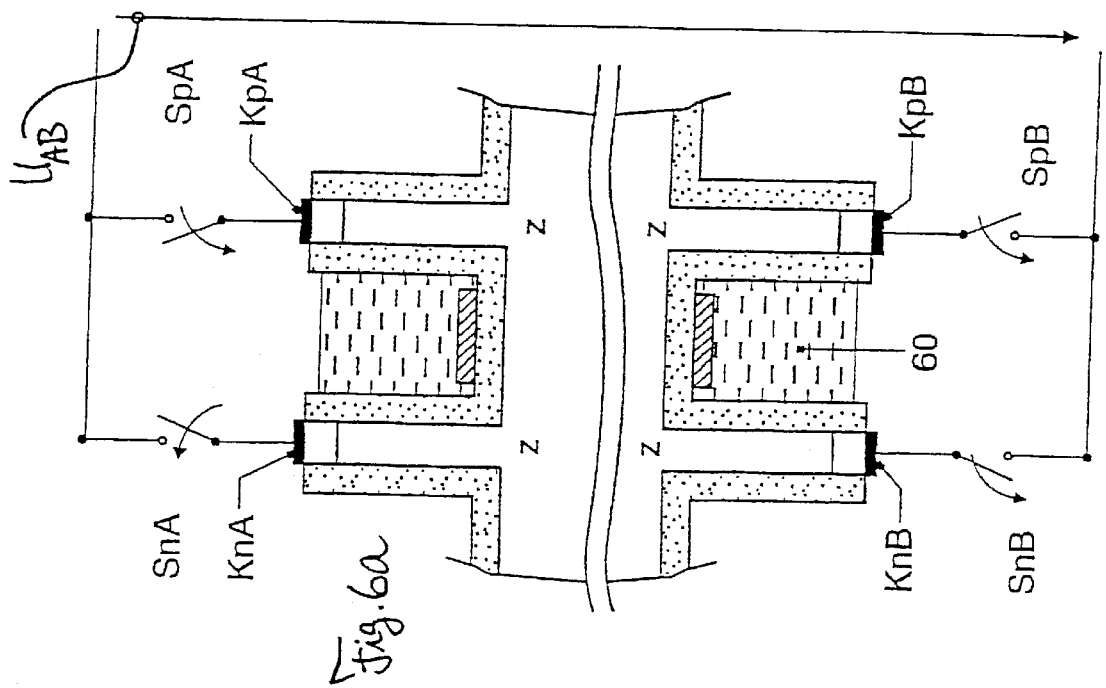
FIG. 6, FIG. 6a illustrate a cascode-like structured bidirectional switch. In this case the gates are not monolithically integrated, instead MOSFET switches: SnA and SpA are provided which conduct the entire current of the bidirectional switch but need to absorb a low reverse voltage only. This permits a greater mesa width of the structure 13. The structure in FIG. 6 corresponds to the trench technology of FIG. 4.
Figure 6:
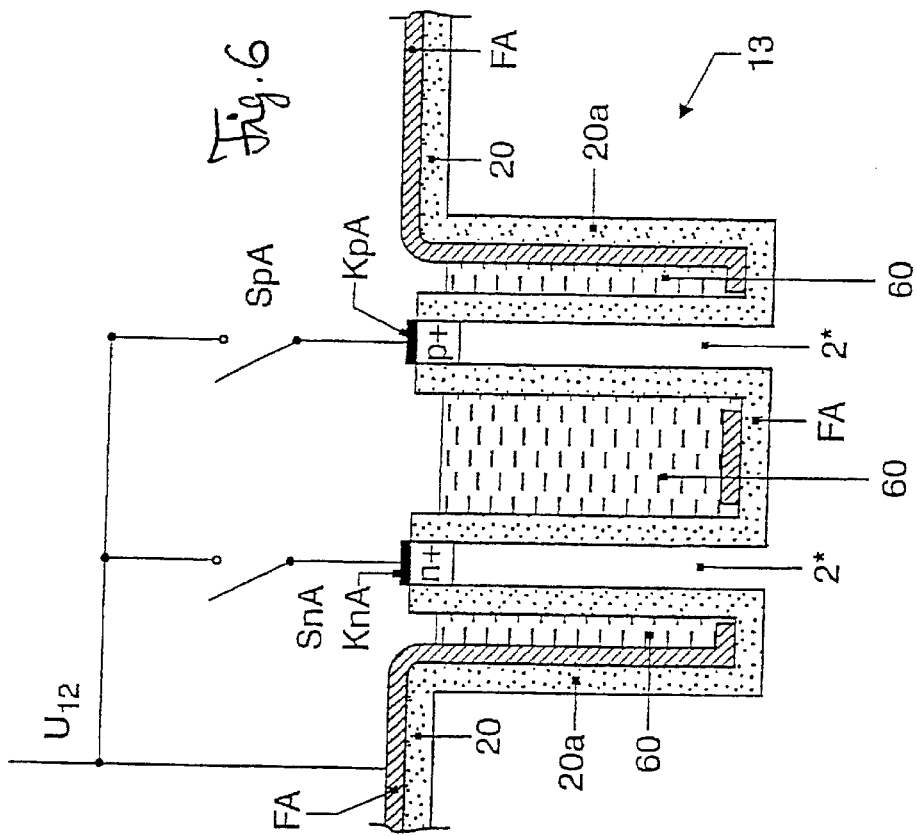

The concept of blocking without using pn junctions may also be used to manufacture highly blocking switches which are controlled via external low blocking switches, so-called "cascode arrangements". The scheme of a structure of this kind made by trench technology is illustrated for the side "A" in FIG. 6. The trenches are filled with an insulator 60, such as glass. The structure on the other side "B" is to be imagined symmetrical again. Now two respective mesas 2* are located close to each other, one of which being n+doped and connected to the field plate FA via a terminal surface KnA and an external switch SnA and the second one being p+doped and connected to the field plate FA of side "A" via a terminal surface KpA and a second external switch SpA. If again a positive potential is applied to the field plate FA opposite the other side "B", the opposing switches SnA and SpB must now be closed and the opposing switches SpA and SnB be opened for the blocking operation, as shown in FIG. 6a. The potential of an open terminal (KpA and KnB) is now displaced to some extent relative to the associated field plate towards that of the opposite side. It may never be displaced in any other direction as with the MOS gates. Therefore two separate terminals are suggested herein for the n+and p+contacts.

The same charge carrier transport takes place within the main crystal, as in FIG. 2. In this case this is not caused by integrated MOS structures but by the external MOS elements. They determine the type of charge carrier, the concentration of which is controlled in the respective transition zone z.

The external switches may be low blocking MOSFETs which, however, must be capable of conducting the entire current of the bidirectional switch. In the forward operation the switches SpA and SnB must be closed and the switches SnA and SpB must be opened accordingly. By simultaneously closing all switches a partial discharge may be achieved.

The concept of controlled blocking without using pn junctions may also be advantageously used for other components. For example, if a component is to block in a controlled manner in one direction only, it is sufficient to apply the structure in accordance with the invention on one side only and the to provide the other side with the corresponding doping supplying the charge carriers for the forward operation. The structure of an IGBT-like component of this type is illustrated in FIG. 7. The component may be controlled by MOS and comprises a particularly advantageous, safe operating area, since current filamentation is avoided. Illustrated is the structure according to FIG. 4, however, any other embodiment of the fine structure could be employed just as well.

FIGS. 8 and 8a show a plan view of a refinement in which the bidirectional switch having the fine structures 14 is configured as a lateral component. A section taken along plane I—I is shown in FIG. 8a; both Figures are to be described simultaneously. Lateral means that all terminals are located on the same side. The two surfaces of the crystalline region, which have so far been described as opposing sides A and B, are here located side by side and are cut through their centers in the two Figures so that only the left and right areas are discernible. The manufacturing effort is facilitated by such a lateral structure, for photo lithography is required on one surface only whereas, on the other side, a dielectric 70 serves to insulate the non-doped or lightly doped semiconductor crystal i, the active region 1 of which being the entire area above the insulating layer 70. A structure of this kind is called SOI—silicon on insulator.

In an exemplary refinement this structure may have an extension from side A to side B of approx. 100 μm, depending on the reverse voltage or blocking voltage to be absorbed.

In FIG. 8 the terminal surfaces KA and KB are shown in partially broken-away representation in order to show the doping zones 3a, 4a which have already been described in connection with FIGS. 1 and 2. Also the trench structures GA, 20a have already been described with respect to FIG. 4. The shape of the MOS structures formed in trench structure differs from FIG. 4; here elongate oval structures have been chosen, which form a row with their longitudinal sides arranged facing each other, and which form respective mesas 2' in between where a lightly doped or non-doped semiconductor crystal is present, in which locations the mesa structures are formed, which have each been given the reference numeral 2 in accordance with the previous Figures.

At the respective strip-like formation, being narrow relative to its height, as shown in FIG. 8, MOS structures are provided on both sides, i.e. one trench gate GA each having an insulating layer 20a insulating it from the environmental area.

The control via the MOS structures is effected analog to the previous Figures. The highly doped regions 3a, 4a enable it, controlled via the lowered mesa structures extending between the lined trench gates, to either deplete the crystal of charge carriers or to inject charge carriers into the crystal, in dependence upon the state of operation of the lateral switch selected by control.

It is to be understood that the conductive connections between the individual trench gates GA and on the other lateral side GB, respectively, which are not represented in FIG. 8, are present in a functioning switch. They have been omitted for reasons of clarity as well as the metallic contact coating shown in partially broken-away representation above the alternating n+and p+regions on the outer side of the respective row of trench gates. On the inner side of the respective row of trench gates there is the non-doped or lightly doped semiconductor crystal for absorbing the reverse voltage or blocking voltage.

We claim:

1. A semiconductor switch having a monolithic semiconductor crystal for switching currents in two directions and suitable to block and reverse block voltages which are significantly higher than the operating voltages of gate circuits, said switch having an on and an off-state in both directions and comprising an active portion and a termination portion, wherein both opposite surfaces of the active portion of the semiconductor switch are provided with fine structures distributed over a wide area, said fine structures having substantially uniform configuration and each including one conductive terminal surface (KA, KB), wherein said distributed fine structures are adapted to move charge carriers in a controlled manner (GA, GB) into the active portion of the semiconductor crystal, thus controlling a concentration of the charge carriers in the active portion and providing the on-state of the semiconductor switch.

2. A semiconductor switch having a substantially non-doped monolithic semiconductor crystal for switching currents in two directions and suitable for blocking voltages which are significantly higher than operating voltages of gate circuits, said switch comprising an active portion and a termination portion wherein opposite surfaces of the active portion are provided with fine structures (10, 11, 12, 13, 14) which are distributed over wide lateral areas, said fine structures are substantially uniformly configured and including conductive terminal surfaces and control surfaces (GA, GB) for moving charge carriers in a controlled manner out of the active portion of the semiconductor crystal, thus controlling a concentration of the charge carriers in the active portion and providing an off-state of the semiconductor switch.

3. Semiconductor switch according to claim 1 or 2, wherein the remaining surface of the active region supports inner field plates (FA; FB) which are applied to the semiconductor crystal in an insulating manner (20, 21), which field plates are conductively connected to the terminal surfaces (KA, KB) on the fine structures for forming two main terminal surfaces for the voltage to be blocked or the current to be switched.

4. Semiconductor switch according to claim 1 or 2, characterized in that the fine structures for controlling the charge carriers in an injecting of extracting manner consist of raised columns or elongate mesas (10), which are spaced from each other at a substantially uniform distance and are provided with a laterally arranged MOS structure (GA, 20, 2; GA, 20, 2*; GB, 20, 2) for controlling the charge carrier concentration in the transition zone (z) of respective fine structure towards the non-doped or only lightly doped semiconductor crystal in the active region (1) of the switch.

5. Semiconductor switch according to claim 1 or 2, wherein the control of the charge carrier concentration in the transition zone (z) of the fine structures towards the remaining active region is effected by
    (a) controlling the concentration of first charge carriers in the fine structures of the one terminal side (A) and
    (b) simultaneously controlling complementary second charge carriers in the fine structures of the other terminal surface (B).

6. Semiconductor switch according to claim 1 or 2, characterized in that the fine structures (10), for contacting, at their ends remote from the transition zone (z) towards the crystalline region (1), which regions are conductively connected to each other via the common terminal surface (KA; KB).

7. Semiconductor switch according to claim 1 or 2, wherein the surface outside of the active region (1) supports outer field plates (50) which are applied to the semiconductor crystal in an insulating manner (51), which field plates are conductively connected to the terminal surfaces (KA, KB) of the fine structures (10, 11, 12, 13, 14) or to the inner field plates (FA; FB).

8. Semiconductor switch according to claim 1 or 2, characterized in that the inner field plates (FA, FB), towards the junction termination in the termination portion, are continued (50) on an insulating layer (51), which continuously increases in thickness towards the edge, and are conductively connected to a screen electrode (52) which projects beyond the semiconductor crystal and is configured in a manner curving away therefrom (convex) (52a).

9. Semiconductor switch according to claim 1 or 2, wherein the fine structures are arranged in a substantially evenly distributed manner which, in at least one direction of the surface, is a multiple of its extension in this direction.

10. A semiconductor switch having at most a weakly doped semiconductor crystal for switching currents in two directions at voltages which are significantly higher than operating voltages of gate circuits, comprising:

an active region (1) and a termination portion (50, 51), wherein the semiconductor switch in the active region (1) comprises, close to the surface, two opposite surfaces of the active region (1) and a plurality of fine structures (10, 11, 12, 13, 14) distributed over a wide area, the structures being substantially uniformly configured and having a conductive terminal surface (KA, KB), said distributed fine structures absorbing and supplying charge carriers, for controlling through associated conductive control surfaces (GA, GB) the charge carriers to the active region (1) of the semiconductor crystal for switching the current to an on state, and from the active region for switching the current to an off state.

* * * * *